United States Patent [19]

Vij et al.

[11] Patent Number: 5,370,118
[45] Date of Patent: Dec. 6, 1994

[54] OPPOSED LOOP-PAIR QUADRATURE NMR COIL

[75] Inventors: Kamal Vij, New Berlin; Eddy B. Boskamp, Menomonee Falls, both of Wis.

[73] Assignee: Medical Advances, Inc., Milwaukee, Wis.

[21] Appl. No.: 172,689

[22] Filed: Dec. 23, 1993

[51] Int. Cl.$^5$ ............................ A61B 5/055; G01R 33/48
[52] U.S. Cl. .................................. 128/653.5; 324/318; 324/322; 324/311
[58] Field of Search ............................ 128/653.2, 653.5; 324/300, 307, 309, 318, 322, 311

[56] References Cited

U.S. PATENT DOCUMENTS

| | | | |
|---|---|---|---|
| 4,712,067 | 12/1987 | Roschmann et al. | 324/318 |
| 4,816,765 | 3/1989 | Boskamp | 324/318 |
| 4,825,162 | 4/1989 | Roemer et al. | 324/318 |
| 4,879,516 | 11/1989 | Mehdizadeh et al. | 324/318 |
| 4,882,540 | 11/1989 | Domenick et al. | 128/653.5 |
| 5,030,915 | 7/1991 | Boskamp et al. | 324/318 |
| 5,057,777 | 10/1991 | Kurczewski | 324/318 |
| 5,221,902 | 6/1993 | Jones et al. | 128/653.5 |
| 5,241,272 | 8/1993 | Friedrich | 128/653.5 |
| 5,302,901 | 4/1994 | Snelton | 324/318 |

FOREIGN PATENT DOCUMENTS 3272739 12/1991 Japan ............................ 128/653.2

*Primary Examiner*—K. M. Pfaffle
*Attorney, Agent, or Firm*—Quarles & Brady

[57] ABSTRACT

A quadrature local coil includes two coil sets placed on opposite sides of the patient, each coil set having a single loop and a split loop so as to be sensitive to quadrature components of a flux field substantially centered between the coil sets. Signals are developed from the loops in a manner to reduce current flow in the loops preventing coupling of the opposing loops and the degradation of the signal. The signals may be summed to produce a single signal of improved signal-to-noise ratio.

6 Claims, 4 Drawing Sheets

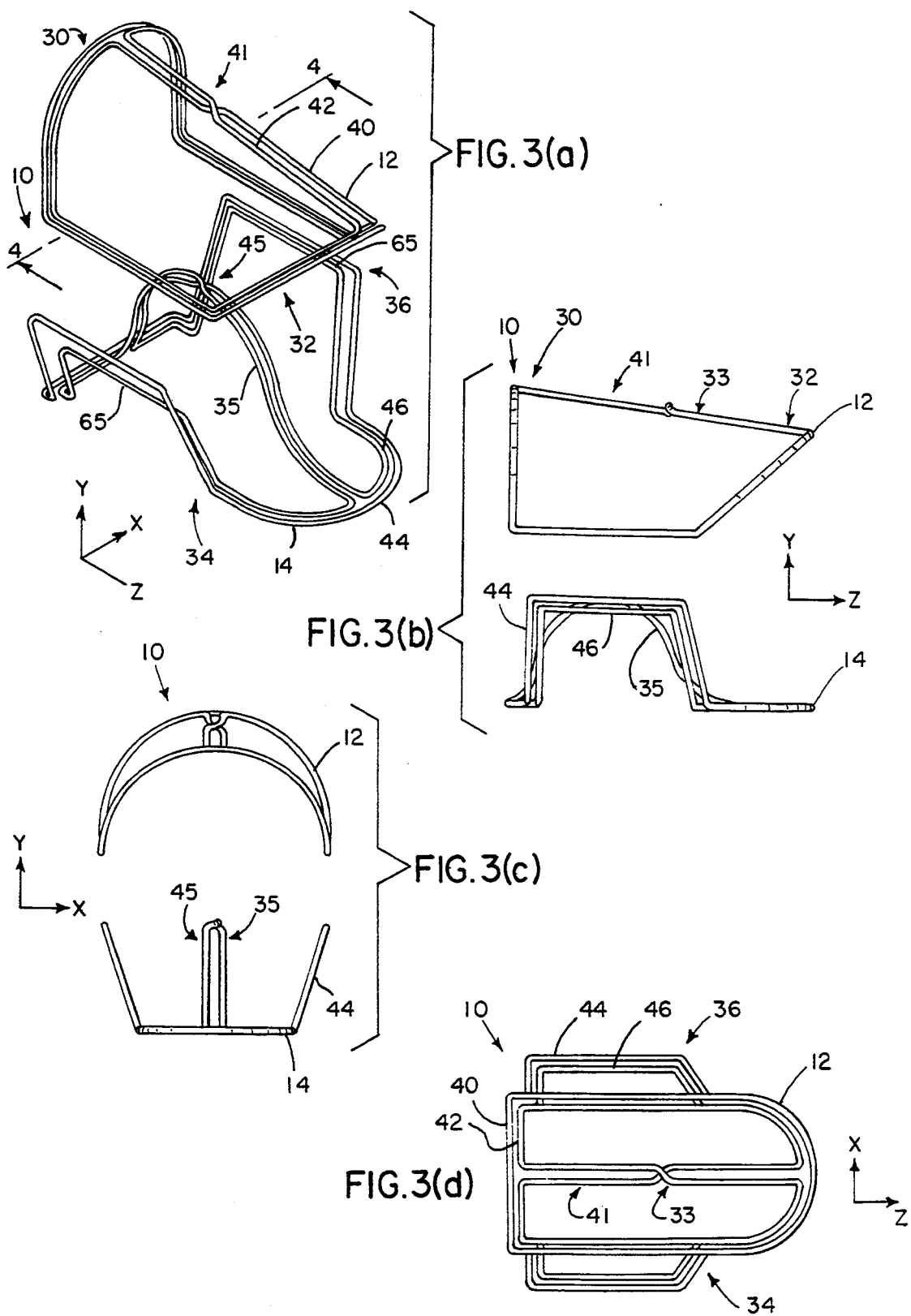

OPPOSED LOOP-PAIR QUADRATURE NMR COIL

BACKGROUND OF THE INVENTION

1. Field of the Invention

The field of the invention is magnetic resonance imaging (MRI) and, in particular, local coils for use in receiving MRI signals.

2. Background Art

A. MRI Imaging

In MRI, a uniform magnetic field $B_0$ is applied to an imaged object along the z-axis of a Cartesian coordinate system, the origin of which is approximately centered within the imaged object. The effect of the magnetic field $B_0$ is to align the object's nuclear spins along the z-axis.

In response to a radio frequency (RF) excitation signal of the proper frequency, oriented within the x-y plane, the nuclei precess about the z-axis at their Larmor frequencies according to the following equation:

$$\omega 32 \ \gamma B_0 \tag{1}$$

where $\omega$ is the Larmor frequency, and $\gamma$ is the gyromagnetic ratio which is a constant and a property of the particular nuclei.

Hydrogen, and in particular the nucleus (protons), because of its relative abundance in biological tissue and the properties of its nuclei, is of principle concern in such imaging. The value of the gyromagnetic ratio $\gamma$ for protons is 4.26 kHz/gauss and therefore, in a 1.5 Tesla polarizing magnetic field $B_0$, the resonant or Larmor frequency of protons is approximately 63.9 MHz.

In a typical imaging sequence for an axial slice, the RF excitation signal is centered at the Larmor frequency $\omega$ and applied to the imaged object at the same time as a magnetic field gradient $G_z$ is applied. The gradient field $G_z$ causes only the nuclei, in a slice with a limited width through the object along an x-y plane, to have the resonant frequency $\omega$ and to be excited into resonance.

After the excitation of the nuclei in this slice, magnetic field gradients are applied along the x and y axes. The gradient along the x-axis, $G_x$, causes the nuclei to precess at different frequencies depending on their position along the x-axis, that is, $G_x$ spatially encodes the precessing nuclei by frequency. The y axis gradient, $G_y$, is incremented through a series of values and encodes the y position into the rate of change of phase of the precessing nuclei as a function of gradient amplitude, a process typically referred to as phase encoding.

A weak nuclear magnetic resonance generated by the precessing nuclei may be sensed by the RF coil and recorded as an NMR signal. From this NMR signal, a slice image may be derived according to well known reconstruction techniques. An overview of NMR image reconstruction is contained in the book "Magnetic Resonance Imaging, Principles and Applications" by D. N. Kean and M. A. Smith.

B. Local Coils

The quality of the image produced by MRI techniques is dependent, in part, on the strength of the NMR signal received from the precessing nuclei. For this reason, it is best to use an independent RF receiving coil placed in close proximity to the region of interest of the imaged object in order to improve the strength of this received signal. Such coils are termed "local coils" or "surface coils". The smaller area of the local coil permits it to accurately focus on NMR signals from the region of interest. Further, the RF energy of the field of such a local coil is concentrated in a smaller volume giving rise to improved signal-to-noise ratio in the acquired NMR signal.

The signal-to-noise ratio of the NMR signal may be further increased by orienting two coil pairs at 90° angles about the imaged object so that each detects RF energy along one of a pair of mutually perpendicular axes. This technique is generally known as quadrature detection and the signals collected are termed quadrature signals.

The outputs of the quadrature coil pairs are combined so as to increase the strength of the received signal according to the simple sum of the output signals from the coils. The strength of the uncorrelated noise component of these signals, however, will increase only according to the square root of the sum of the squares of the noise components. As a result, the net signal-to-noise ratio of the combined quadrature signals increases by approximately $\sqrt{2}$ over the signal-to-noise ratio of the individual signal.

The quadrature orientation of the two coils introduces a 90° phase difference between the NMR signals detected by these coils. Therefore, combining the outputs from the two quadrature coils, to achieve the above described signal-to-noise ratio improvement, requires that one signal be shifted to have the same phase as the other signal so that the amplitudes of the signals simply add.

Such phase shifting and combining is typically accomplished by means of a hybrid network. Hybrid networks are four-port networks known in the art and having the property that when the four ports are properly terminated, energy input to two of the ports, with the proper relative phase angles, will be combined at one of the remaining two ports. The antenna coils are attached to two of the ports and the output lead is attached to a third port and produces the sum of the signals from the antenna coils, one being shifted so that they add in-phase. The remaining uncommitted port is connected to a termination resistor.

As used herein, the term quadrature coil and quadrature signal, will refer to the detecting of the NMR signal along multiple axes and combining the signals so collected, with the appropriate phase shifts to produce a signal of improved signal-to-noise ratio.

1. Volumetric Local Coils

One method of constructing a local coil is the "bird cage" construction in which two conductive loops are spaced apart along a common longitudinal axis and interconnected by a series of regularly spaced longitudinal connectors. The impedance of the loops and of the longitudinal conductors is adjusted so that the coil may be excited into resonance by a rotating transverse magnetic field at the Larmor frequency. A quadrature signal may be obtained by monitoring the current through two longitudinal conductors spaced at 90° around the periphery of the loops. Such coils are described in detail in U.S. Pat. Nos. 4,680,548, 4,692,705, 4,694,255 and 4,799,016.

For certain imaging tasks, particularly imaging of the neck, the use of a volumetric coil such as a bird cage is impractical because of the diameter of the coil required to clear the patient's shoulders so that the region of sensitivity of the coil may be centered about the neck. The use of "cut outs" in one of the conductive loops of the bird cage to fit about the shoulders of the patient has proven unsatisfactory.

2. Planar Local Coils

The use of volumetric local coils of conventional bird cage or other quadrature design may be undesirably constraining to the patient who must be surrounded by the relatively small volume of the tubular coil within the magnet bore. Often, in order that the local coil may be conveniently located on the patient, it is desirable that the quadrature local coil be opened and then closed about the desired anatomy. Coils that may be thus opened are not easily implemented with the bird cage design.

It is known, therefore, for certain imaging applications, such as the imaging of the spine, to construct a quadrature local coil on a one-sided cradle to be attached to the upper surface of the patient support table so that the patient may simply lie on top of the coil and so that the coil structure is not unduly constraining. Such open coils are termed "planar" coils to distinguish them from "whole volume" coils such as might be constructed of opposed saddle coils or solenoids or a birdcage. The prior art has recognized the desirability of a quadrature, planar coil. See, for example, U.S. Pat. No. 5,030,915, issued Jul. 9, 1991 to Boskamp, hereby incorporated by reference.

In such quadrature planar coils, a pair of coils is disposed generally along a plane to have a sensitivity to flux within a region of interest directed parallel to that plane. A third coil, also positioned within the plane, has a sensitivity normal to the plane of the pair to produce a signal in quadrature from the pair. Thus, a quadrature coil can be realized from coils disposed substantially within a single plane on one side of the patient.

Critical to the operation of a quadrature planar coil is isolation between the coil pair and the third coil. This isolation is obtained by accurately aligning the third coil between the coil pair so that the flux from each of the coil pair and the third coil has a balanced effect on the other producing no net flow of current.

A quadrature planar coil may be readily placed, without interference from the patient's shoulders, in the region of the neck. Unfortunately, its region of sensitivity is closely concentrated near the plane of the coils which may not be suitable for imaging structures in the neck region removed from that plane.

For this reason, a specialized two-part saddle-shape neck coil such, as is taught in U.S. Pat. No. 5,221,902 assigned to the same assignee as the present invention and hereby incorporated by reference, was designed which permits the accommodation of the patient's shoulders allowing centering the useful volume of the coil in the neck region.

This coil, however, does not provide the benefits of quadrature detection.

SUMMARY OF THE INVENTION

The present invention provides a quadrature local coil suitable for imaging portions of the body such as the neck where a bird cage type coil would be impractical and a planar quadrature coil would present too shallow of an imaging depth.

Generally two quadrature "planar" coils are opposed about the volume to be imaged. Specialized interface circuitry is used to eliminate the coupling, or loss of isolation, that would otherwise be expected of this combination, and to combine the signals from these two pairs.

Specifically, the local coil comprises a first coil set positioned adjacent to the imaging volume, the set having a first coil with a first reception pattern which couples with an RF magnetic field having a first orientation within the imaging volume. The first coil produces a first signal. The first coil set also has a second coil with at least one diametric conductor to divide the second coil into a pair of loops having a second reception pattern which couples to an RF magnetic field of a second orientation within the imaging volume to produce a second signal. The second orientation is substantially 90° from the first orientation to produce a quadrature sensitivity. This first coil pair is substantially opposed about the imaging volume by a second coil pair. The second coil pair has a third coil with a reception pattern of the first orientation to produce a third signal and fourth coil having at least one diametric conductor to divide the fourth coil into a pair of loops having the second reception pattern to produce a fourth signal.

The coil may include combiners for combining the first and third signals and for combining the second and fourth signals into combined output signals. Another combiner combines the output signals with a relative phase shift in one signal to produce a quadrature output.

It is one object of the invention to provide a quadrature coil having good accessibility and a well located imaging area by combining opposed planar style quadrature coils. Each half of the coil is electrically independent and may be hinged or otherwise opened with respect to the other half to provide good patient access. When the two halves are closed in opposition, the imaging area may be approximately centered between the two halves rather than proximate to one, as would be the case with a single planar coil.

Each of the first, second, third and fourth coils are isolated by means of an electrical network which blocks current flow in the coils at the Larmor frequency.

This electrical network may comprise a parallel capacitor and inductor tuned for parallel resonance at the Larmor frequency, the inductor being in series with the input of a high impedance preamplifier connected through a quarter wave length network.

Thus, it is another object of the invention to provide the benefits of the above described coil design without producing detrimental coupling between the coils as would otherwise occur with this new geometry and which would reduce isolation between the coils and thus the intended signal to noise benefits.

Other objects and advantages besides those discussed above will be apparent to those skilled in the art from the description of the preferred embodiment of the invention which follows. Thus, in the description, reference is made to the accompanying drawings, which form a part hereof, and which illustrate one example of the invention. Such example, however, is not exhaustive of the various alternative forms of the invention. Therefore, reference should be made to the claims which follow the description for determining the full scope of the invention.

BRIEF DESCRIPTION OF THE DRAWINGS

FIGS. 3(a) through 3(d) are perspective, left side elevation, front elevation, and top plan views respectively of posterior and anterior coil sets of the local coil of FIG. 1;

DETAILED DESCRIPTION OF THE PREFERRED EMBODIMENT

Figure 1:
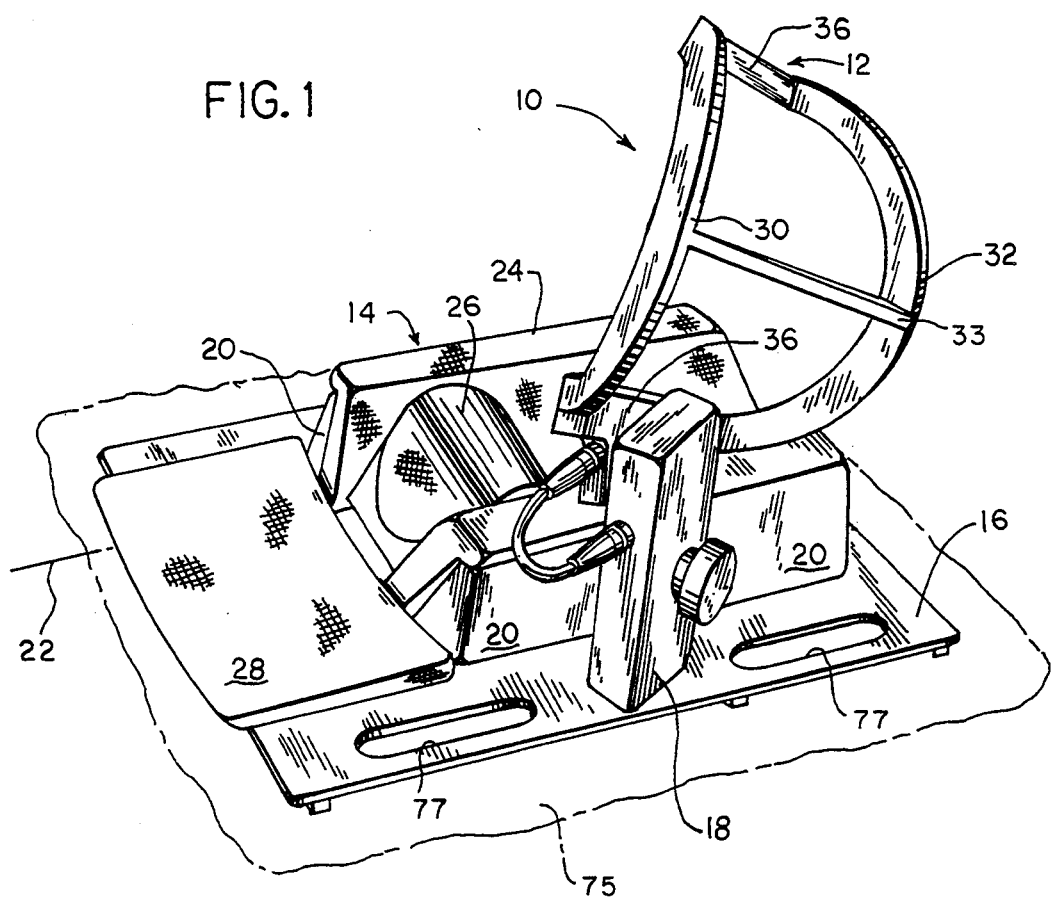
FIG. 1 is a perspective view of a housing supporting the local coil of the present invention as adapted for imaging of the neck and showing the posterior and anterior coils in the open position.
Figure 2:
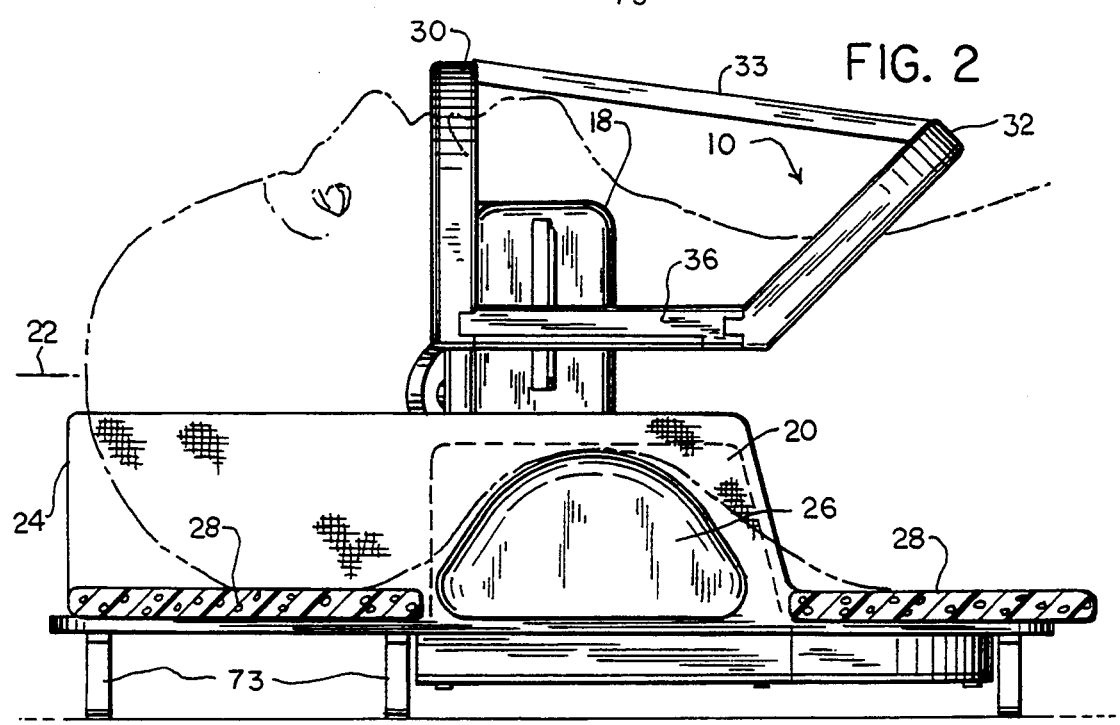
FIG. 2 is an elevation in cross-section along a midsagittal plane showing positioning of the local coil of FIG. 1 on a patient.

Referring to FIGS. 1 and 2, quadrature coil 10 of the present invention, when configured for use in neck imaging, includes opposed anterior and posterior coil sets 12 and 14. The posterior coil set 14 is supported by a generally horizontal, planar base 16 whereas the anterior coil set 12 is held away from the base 16 by an extension tower 18 projecting perpendicularly upward from the horizontal surface of the base 16. The base 16 has on its lower surface a number of downwardly extending arc shaped ribs 73 that fit against the concave upper surface of the MRI table 75 (shown in FIG. 1) to stiffen the base 16 and to provide additional support for the base 16 against the table 75.

Also shown in FIG. 1, the base 16 includes cut out hand grips 77 which permit it to be readily removed from the table 75.

Referring to FIG. 2, when the local coil 10 is in use, the patient's head rests back against the upper surface of the base 16 with the patient's frontal plane generally parallel to the surface of the base 16. Left and right medially extending wedges 20 rise from the upper surface of the base 16. The wedges are symmetrically opposed about the medial axis 22 and support and position a trough shaped cushion 24 that cradles either side of the patient's neck and head when the patient is positioned in the coil 10. Held within the trough is a transverse arched foam pad 26 which supports the back of the patient's neck and tips the patient's head upward on the base 16. The foam pad 26 also covers an arcade conductor to be described below.

Flat foam cushions 28 are positioned against the base 16 above and below the arched foam pad 26 along the medial axis 22, to support the back of the patient's head and shoulders.

The anterior coil set 12 includes an arcade nose arch 30 and chest arch 32 joined to each other at the arch ends by substantially straight left and right sidebars 34 and 36 which form a saddle shaped guide. The left sidebar 34 is attached to and may hinge about the extension tower 18 so as to move the anterior coil set 12 into an open or closed position. In the closed position, the left and right sidebars 34 and 36 are parallel to the upper surface of the base 16 and positioned above the left and right wedges 20. In the closed position, the nose arch 30 extends downward around the patient's face in a transverse plane, and the chest arch 32 extends downward around the patient's lower neck in a plane angled between the transverse and frontal planes.

As mentioned, the left sidebar 36 of the anterior coil set 12 is attached to a hinge (not shown) which permits the chest arch 32 to be retracted away from the point of patient entry when the anterior coil set 12 is moved to the open position, thus improving the access for the patient who normally lays back against the base 16 and whose head enters the coil set at a relatively steep angle. The above structural components are fabricated from a non-magnetic, non-conductive, polymeric material to reduce their interaction with the magnetic and electrical fields of the MRI equipment. The mechanism of opening and adjusting the anterior coil set 12 is described in detail in U.S. Pat. No. 5,166,618 entitled: "NMR Neck Coil with Passive Decoupling" hereby incorporated by reference.

Referring to FIGS. 1, 2 and 3(a) through 3(d), the anterior and posterior antenna coil sets 12 and 14 each include two distinct antenna loops. The anterior coil set 12 has a single loop 40 and a split loop 42. Electrically the split loop 42 differs from the single loop in that it is effectively bifurcated by a conductor 41 along the medial axis so as to produce two electrical loops. This additional bifurcating conductor 41 of the split loop 42 passes along the mid-sagittal anterior beam 33. Mechanically, the split loop 42 is formed from a single conductor twisted to a figure-eight shape with the two loops of the figure-eight abutting along the medial axis 22 to form the bifurcating conductor 41.

With the exception of the bifurcating conductor 41, the single loop 40 and split loop 42 of the anterior coil set 12 conform generally to the support structure of the anterior coil set 12: following the nose arch 30 through the right sidebar 36, following the chest arch 32, and returning through the left sidebar 34 to the nose arch 30.

Referring still to FIGS. 3(a) through (d), the posterior coil set 14 also comprise a single loop 44 and a split loop 46, the latter differing from the former again by the introduction of a bifurcating conductor 45 which follows the arch of the neck of the patient beneath the arched foam pad 26. Like the split loop 42 of the anterior coil set 12, the split loop 46 is essentially a single conductor formed in a FIG. 8 with the conductors of each loop of the 8 forming the bifurcating conductor 45 in the midsagittal posterior arch 35. With the exception of the conductors through this midsagittal posterior arch 35, the conductors of the single loop 44 and the split loop 46 follow generally the support structure previously described having arcade portions which rise on either side of the patient's neck, when the patient is positioned on the coil set 14, and that fit into the channels in the left and right wedges 20. These arcade portions are connected by conductor segments substantially parallel to the plane of the base 16 and contained with the base 16 in a protective housing 68.

Figure 5:
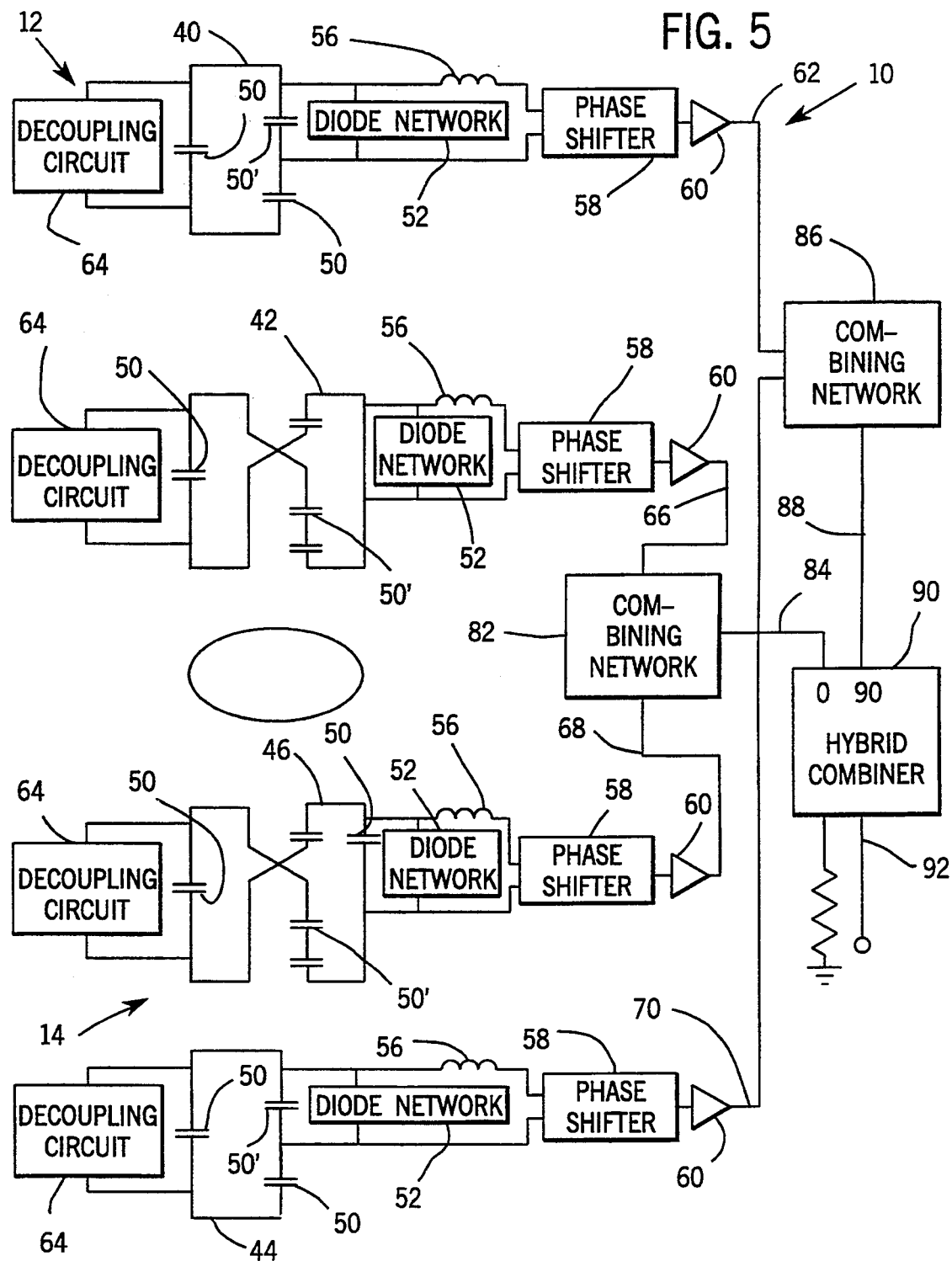
FIG. 5 is a schematic diagram of the coils of the coil sets of FIG. 1 showing combining of the signals from each coil.

Referring to FIG. 5, each of the loops 40, 42, 44 and 46 is cut at two points spaced equally about the loop. These cuts are bridged by capacitors 50 which together with the intrinsic inductance of the conductors of the loop, serve to tune the loop into resonance at a frequency equal to the Larmor frequency of the precessing nuclei whose NMR signals are to be detected.

A signal from each loop 40, 42, 44 and 46 is developed across one such capacitor 50' as will be described in detail for the loop 40 of the anterior coil set 12. The remaining loops provide signals in an analogous manner as will be well understood by those of ordinary skill in the art.

For single loop 40, the capacitor 50' is bridged by a back-to-back diode network 52 which serves to limit the voltage of the signal developed across capacitor 50' to approximately 7/10ths of a volt peak-to-peak. Voltages of greater than this threshold would otherwise be obtained during the excitation of the nuclei by the RF excitation coil. These high voltages may also be avoided by active decoupling of the loops, as will be described, but back-to-back diodes 52 provide a second means of decoupling the single loop 40 from the excitation signal in the event that active decoupling is not provided.

One side of capacitor 50' also connects to inductor 56 which in turn is connected to a phase shifter 58. This phase shifter may be a cable or a discrete network. The voltage across capacitor 50' is carried via the phase shifter 58 to preamplifier 60 which at its output produces a signal 62 proportional to the signal received by the single loop 40. Preamplifier 60 is low noise preamplifier such as are well known in the art.

Phase shifter 58 provides an impedance transformation of the input impedance of the preamplifier 60 so as to present an impedance joining the inductor 56 across the capacitor 50'. This joining impedance provides an effective shunting of capacitor 50' by an inductance whose value is determined by the series combination of the inductor 56 and the transformed input impedance of preamplifier 60.

The inductance and the capacitor 50' are selected to have approximately equal impedance at the Larmor frequency and thus to present a parallel resonance circuit across the gap connected by capacitor 50'. The net result is that, at the Larmor frequency, essentially no current flows through the single loop 40 and thus flux is not generated by the loop 40 such as might couple the loop 40 to loop 44. The importance of this decoupling will be discussed in detail below.

As mentioned, loop 40 may also be actively decoupled by means of a well known decoupling circuit 64 (shown only as a block) which includes a diode that may be forward biased by an independent source of DC power (not shown) to connect an inductor in the decoupling block 64 across capacitor 50. The inductor is sized to detune the loop 40 when the diode is forward biased and during the RF excitation of the nuclear spins, thus preventing excessive signals from reaching and damaging the preamplifier 60. The source of DC power must be timed to the RF excitation and is generally provided by the manufacturer of the MRI equipment.

Loops 42, 46 and 50 are likewise connected to their own preamplifiers 60 for the production of signals: 66 for split loop 42, 68 for split loop 46, and 70 for single loop 44. As with loop 40, the signals are detected by preamplifiers 60 that are connected to inhibit current flow through the respective coil and thus to provide a high degree of isolation between the coils such as would otherwise not be possible.

Figure 6:
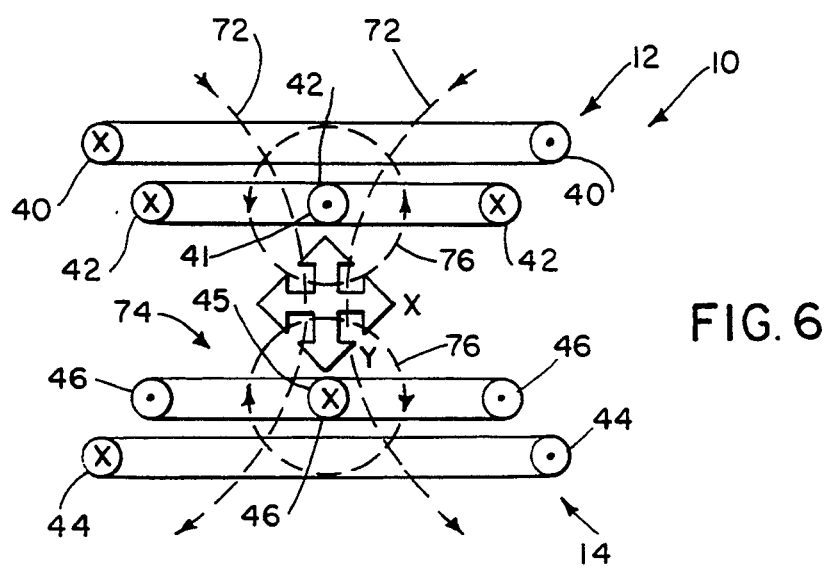
FIG. 6 is a figure similar to that of FIGS. 4(a) and (b) showing quadrature detection of the two coil pairs in a region of interest centered between the coil pairs.

Referring now to FIG. 6, the single loops 40 and 44 will have an induced voltage as a result of flux 72 along a y-axis line passing through both of their centers. The polarity of the connections of single loops 40 and 44 to their respective preamplifiers 60 is adjusted such that flux line 72 passing through both loops 40 and 44 in the same direction produce signals 62 and 70 that are in the same phase. Within a region of interest 74, flux lines 72 are parallel to the y-axis and thus provide a y-axis sensitivity for quadrature detection.

In contrast, split loops 42 and 46 will be sensitive to flux lines 76 in circling their centermost bifurcating conductor. Split loops 42 and 46 are thus sensitive to flux lines within the region of interest 74 generally perpendicular to flux lines 72 thus providing an x-axis of quadrature sensitivity. Split loops 42 and 46 are connected so that counter cyclic fluxes 76 passing through the corresponding split loops 42 and 46 produce matching polarities that add together.

Figure 4A:
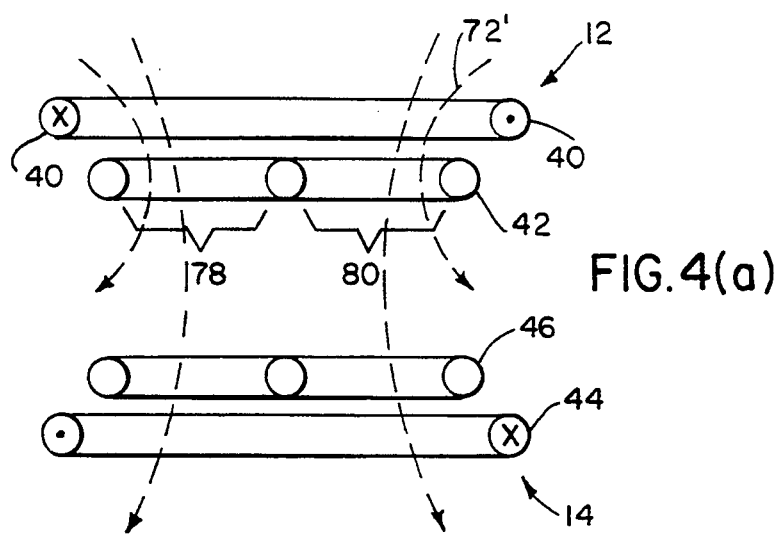
FIGS. 4(a) and (b) are cross-sections of the conductors of the present invention showing magnetic coupling between the opposing corresponding coils of an anterior and posterior coil set.

As described above, unlike prior art planar quadrature coils, each of the loops of the coil sets of the present invention are not intrinsically isolated from the other loops. Referring to FIG. 4(a), absent the decoupling effect of the connection of preamplifiers 60, described above, a cyclic current passing through the single loop 40 generates flux lines 72' which will be intercepted by single loop 44 to induce current in that single loop 44. Thus, the loops 40 and 44 are not isolated, and this has the effect of detuning the loops and thus decreasing the signal-to-noise ratio of their combined signal.

Figure 4B:
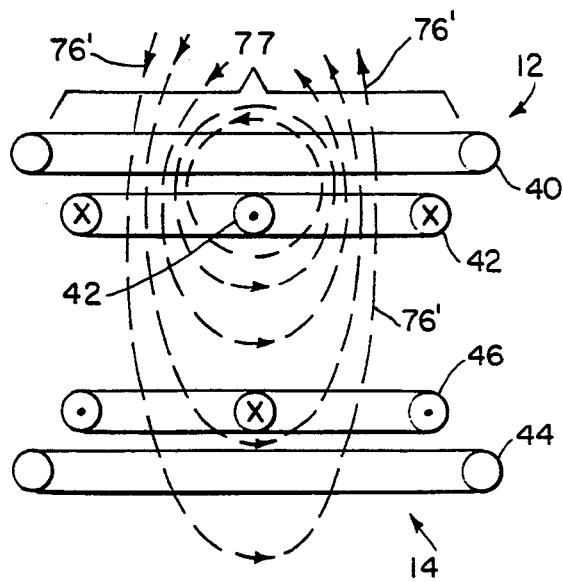

In contrast, these same flux lines 72' passing between the two loops of split loop 42 in intervals 78 and 80, and split loop 46 induce countervailing currents which cancel within the split loops 46 and 42 and thus in general, each split loop 42 or 46 is intrinsically isolated from either single loop 40 and 44. Referring further to FIG. 4(b), a current flowing in either of split loops 42 or 46 produces countervailing flux lines 76 which pass in both directions in equal density through loops 40 and 44 (in region 77, for example). Thus, the single loops 40 and 44 are also intrinsically isolated from the split loops 42 and 46.

Yet, the countervailing flux lines 76' generated by current flow in split loop 42 are such as to generate a current when received by split loop 46. Thus, the split loops 42 and 46 are not intrinsically isolated from each other absent the current inhibiting circuit of inductor 56, cable 58 and preamplifier 60 which by inserting a parallel resonance circuit into each of the loops 40, 42, 44 and 46 minimizes current flow in those loops preventing the generation of the fluxes which might otherwise couple the loops and degrade the improved signal to noise ratio to be obtained by this quadrature design.

Referring again to FIG. 5, the signals 66 and 68, from the split loops 42 and 46 respectively, are summed by means of a combining network 82 providing the necessary combining and impedance matching of the signal 66 and 68 according to the polarities described with respect to FIG. 6. The combining network 82 may be a hybrid combiner such as a well known in the art. The output of the combiner 82 yields the x-axis of the quadrature signal 84.

Likewise, signal 62 and 70 from single loop 40 and 44 are combined by a second combiner 86 identical to that of 82. The output of the combiner 86 produces the y-axis component of the quadrature signal 88. Signals 88 and 84 are in turn provided to a 90° hybrid combiner 90 which combine them to produce the NMR signal 92 having improved signal-to-noise ratio.

The above description has been that of a preferred embodiment of the present invention. It will occur to these who practice the art that many modifications may be made without departing from the spirit and scope of the invention. For example, the two loops of the posterior cell 14 may be physically separate, provided they are substantially adjacent and have their signals combined as described. Clearly, the position of the anterior and posterior loops 44 and 46 may be reversed. Further, it will be apparent from this description that the present coil design may be used not only in receive only coils but in coils that also transmit the exciting RF MRI pulse. In order to apprise the public of the various embodiments that may fall within the scope of the invention, the following claims are made.

I claim:

1. An NMR probe for obtaining an NMR signal from precessing nuclei within an imaging volume, the probe comprising:

a first coil set positioned adjacent to the imaging volume including:

(a) a first coil having a first reception pattern which couples to an RF magnetic field of a first orientation within the imaging volume to produce a first signal;

(b) a second coil having at least one diametric conductor to divide the second coil into a pair of loops having a second reception pattern which couples to an RF magnetic field of a second orientation within the imaging volume to produce a second signal, the second orientation having an angular separation from the first orientation of substantially 90° measured in the direction of the precession of nuclei; and a second coil set opposed substantially symmetrically to the first coil set about the imaging volume including:

(c) a third coil having a third reception pattern which couples to the RF magnetic field of the first orientation within the imaging volume to produce a third signal;

(d) a fourth coil having at least one diametric conductor to divide the fourth coil into a pair of loops having the second reception pattern which couples to the RF magnetic field of the second orientation within the imaging volume to produce a fourth signal.

2. The NMR probe of claim 1 including additionally;

a first combiner means receiving the first and third signal for combining the first and third signals into a combined output signal;

a second combiner means receiving the second and fourth signals for combining the second and fourth signals into a combined output signal; and a third combiner means for combining the output signals from the first and second combiner means so that the output signal from the first combiner means is shifted in phase by 90° with respect to the output signal from the second combiner means.

3. The NMR probe of claim 1 wherein the first coil is saddle shaped for embracing the frontal half of a patient's neck and wherein the second coil is saddle shaped for embracing the posterior portion of the patient's neck.

4. The NMR probe of claim 3 wherein the diametric conductors of the second and fourth coils are positioned to lie in a midsagittal plane when the first and second coils sets are positioned on the patient.

5. The NMR probe of claim 1 including an electrical network blocking current flow in the coils at a signal frequency.

6. The NMR probe of claim 1 including a capacitive element, an inductive element, a phase shifting network and a preamplifier and wherein at least one of the first, second, third, and fourth signals is taken across the capacitive element in series with the respective coil and received by the inductive element connected via the phase shifting network to the preamplifier together to shunt the capacitive element with an impedance; and wherein the capacitive element and the shunting impedance form a parallel resonant circuit at a frequency of the NMR signal.

* * * * *